(12) United States Patent
Burke et al.

(10) Patent No.: US 8,543,178 B2
(45) Date of Patent: Sep. 24, 2013

(54) SUPERCONDUCTOR INDUCTION COIL

(75) Inventors: Theodore E. Burke, Volant, PA (US); Frank Li, Warren, OH (US)

(73) Assignee: Ajax Tocco Magnethermic Corporation, Warren, OH (US)

( * ) Notice: Subject to any disclaimer, the term of this patent is extended or adjusted under 35 U.S.C. 154(b) by 1270 days.

(21) Appl. No.: 12/187,650

(22) Filed: Aug. 7, 2008

(65) Prior Publication Data
US 2009/0118126 A1    May 7, 2009

Related U.S. Application Data

(60) Provisional application No. 60/984,935, filed on Nov. 2, 2007.

(51) Int. Cl.
*H01L 39/02*  (2006.01)
*H01B 12/00*  (2006.01)
*H05B 6/16*   (2006.01)
*H05B 6/42*   (2006.01)

(52) U.S. Cl.
USPC ......... 505/211; 505/163; 505/230; 505/232; 505/704; 505/887; 373/152; 373/154; 373/160; 373/165; 219/672; 219/675; 219/677; 174/15.4; 174/125.1

(58) Field of Classification Search
USPC ......... 505/211, 230, 231, 237–238, 707–705; 174/125.1; 428/469, 701; 219/622, 635, 219/672–677; 373/152–154, 166
See application file for complete search history.

(56) References Cited

U.S. PATENT DOCUMENTS

| 5,781,581 | A  | * | 7/1998  | Fishman et al. | 373/152 |
| 5,787,110 | A  | * | 7/1998  | Fishman et al. | 373/151 |
| 6,730,893 | B1 | * | 5/2004  | Runde          | 219/635 |
| 2004/0266628 | A1 | * | 12/2004 | Lee et al.   | 505/238 |
| 2006/0157476 | A1 |   | 7/2006  | Magnusson    |         |

FOREIGN PATENT DOCUMENTS

| CN | 101017729    | 8/2004 |
| WO | WO 03/044813 | 5/2003 |

* cited by examiner

*Primary Examiner* — Stanley Silverman
*Assistant Examiner* — Kallambella Vijayakumar
(74) *Attorney, Agent, or Firm* — Fay Sharpe LLP

(57) ABSTRACT

An induction heating apparatus that can operate at current frequencies of greater than 60 Hz and at least 1 kW. The induction heating apparatus includes a high frequency power supply, a superconductive induction coil, and a fluid cooling system. A fluid cooling system is designed to cause a cooling fluid to flow at least partially about and/or through the superconductive induction coil.

36 Claims, 4 Drawing Sheets

SUPERCONDUCTOR INDUCTION COIL

The present invention claims priority on U.S. Provisional Application Ser. No. 60/984,935 filed Nov. 2, 2007 entitled "HTS Superconductor Wire for Making an Inductor Coil", which is incorporated herein by reference.

The present invention is directed to an apparatus and a method for heating a workpiece with the use of a superconducting material, particularly to an apparatus and method of induction heating and/or melting a workpiece by an induction coil that is at least partially formed from a superconductor material, and more particularly to an apparatus and method of induction heating and/or melting a metallic or non-metallic workpiece by an induction coil that is at least partially formed from an HTS superconductor material.

BACKGROUND OF THE INVENTION

Induction heating apparatuses used to heat or melt metals operate on the principle of inducing eddy currents in the metal workpiece to be heated. The eddy currents are induced in the metal workpiece by passing an alternating current through an induction coil to generate a time-varying magnetic field, or induction field. Depending upon the magnitude and frequency of the alternating current in the induction coil, the induction field can be used for melting and/or heating the metal workpiece.

The efficiency of an induction coil to melt or heat a metal workpiece depends, in part, on the amount of energy (in the form of electromagnetic energy) which couples from the induction coil to the metal workpiece and is converted into heat energy in the metal workpiece. Present materials that are used to manufacture induction coils have the disadvantage of resistive losses within the conventional materials (i.e., copper) used to form the induction coil. In particular, anonferrous load of induction coils have efficiencies as low as 40% due to the current to heat them inductively is very large. The resistive losses are based on the square of the current, thus become significant when large currents are used to inductively heat a metal workpiece.

In an effort to reduce the resistive losses, some induction coils have been manufactured using superconducting materials. However, it has been found that superconductors produce losses when exposed to an alternating magnetic field. As such, the heat from the AC losses in the superconductors must be cooled at very low temperatures, which cooling can be very expensive. Superconductors have been used for some time in the medical industry for Magnetic Resonance Imaging. Superconductors have also been used in the motor industry for winding armatures to make large motors much smaller. In the area of Magnetic Hydrodynamic Drives, superconductors have been used in large ships. Transmission lines made from superconductors are used to carry large amounts of current and are in place around the United States.

One possible advance with regard to superconductors is the formation of a static or DC magnetic field that has little or no energy losses. Superconductors can, under DC conditions, conduct electric current with very little energy losses. Several types of induction coils that include superconductor materials are disclosed in U.S. Pat. Nos. 5,781,581 and 6,730,890, United States Publication No. 2006/0157476, Chinese publication No. CN 101017729, Norwegian Patent No. 308,980, and PCT Publication No. WO 03/044813, all of which are incorporated entirely herein.

Although these early uses of superconductor materials in induction coils had great potential, these superconducting materials were very expensive to use, the cooling systems requiring use of the superconducting materials was also very expensive and complicated to use, and the configuration of the induction coil that included the superconducting material was difficult to manufacture due to the configuration requirement of the superconducting material.

In view of the current state of induction coils, there remains a need for an induction coil that includes a superconducting material, and which induction coil is easier to manufacture and simpler and less costly to operate.

SUMMARY OF THE INVENTION

The present invention is directed to an apparatus and a method for heating a workpiece with the use of a superconducting material, and more particularly to an apparatus and method of induction heating and or melting a metallic or non-metallic workpiece by an induction coil that is at least partially formed from a High Temperature Superconductor (HTS) material. In one non-limiting embodiment of the invention, there is provided an improved method and apparatus for heating and melting materials using an induced magnetic field with an HTS material that fully forms or is included in an induction coil. The HTS material can be formed into an HTS wire that is manufactured for the purpose of carrying electrical current. The HTS wires can be included in an induction coil, which are normally copper conductors. The shape of the induction coil is often a helical wound coil of induction wire or tube; however, it can be appreciated that the induction coil that includes the HTS wire can be formed in any shape whose purpose is to induce current into a workpiece that acts as a current-carrying load of the induction coil. In another and/or alternative non-limiting embodiment of the invention, the induction coil that includes the HTS wire can be designed to operate at higher frequencies than line frequency (60 Hz). In prior art induction coils that included a superconducting material, the current frequency that was supplied to the induction coil did not exceed 60 Hz. The induction coil of the present invention is designed to operate at current frequencies of 60 Hz or lower or at frequencies that exceed 60 Hz (e.g., 100 Hz, 200 Hz, 300 Hz, 400 Hz, 500 Hz, 600 Hz, 5 kHz, 10 kHz, 100 kHz, 1000 kHz, 10000 kHz, etc.). It is believed that the induction coil that includes the HTS wire of the present invention can increase efficiencies of induction coil at all frequencies. In one non-limiting aspect of the present invention, the induction coil that includes HTS wire of the present invention can be used at frequencies of 75-200 Hz, and more particularly at about 100 Hz. During conventional induction heating and/or melting of a workpiece, the induction coil converts electricity into thermal energy in the workpiece using alternating magnetic fields. The induction coil efficiency can be up to about 96% for magnetic ferrous workpieces. For non-ferrous metal and other non-magnetic conductive materials, the efficiency of heating by the induction coil can drop to as low as about 40% due to $I^2R$ losses in the induction coil. The High Temperature Superconductor (HTS) induction coils that include HTS wire of the present invention can achieve nearly zero resistance at low temperatures. As such, the $I^2R$ losses of the HTS induction coil of the present invention can be nearly zero, thereby increasing the efficiency for the non-ferrous metal and nonmagnetic conductive materials to approach 100% (e.g., at least 80%, at least 90%, etc.). The current density of the HTS induction coil of the present invention wire is believed to be much higher than classic induction coil conductors, such as an induction coil formed of copper. With high current densities, the HTS induction coil of the present invention is believed to form an induction magnetic field strength that is as strong or stronger than classic induction coil conductors. Such stronger induction magnetic field strength is believed to improve the efficiency and effectiveness of induction heating and melting applications. As defined herein, low temperature is defined as a temperature at or above 77° K (−196° C.) and at or below ambient temperature 295° K (22° C.). As such a superconducting material that is not superconductive at a temperature (i.e., critical temperature) at or above 77° K is not an HTS material as defined in this invention.

In one non-limiting aspect of the present invention, the induction coil of the present invention includes a plurality of HTS wires that are positioned in parallel with one another to accommodate the current requirements of various induction applications. As can be appreciated, any induction coil of any shape can potentially be formed in accordance with the present invention. Non-limiting induction coils that can be used, include, but are not limited to, wide rectangular coils, channel heating and channel melting coils, coreless melting coils, billet heating coils, bar heating coils, etc.

In another and/or alterative non-limiting aspect of the present invention, the use of one or more HTS wires that can be used as or included in an induction coil and cooled by liquid having a boiling point or sublimation point that is no more than 295° K (22° C.) at 1 atm. In one non-limiting embodiment of the invention, the cooling liquid is or includes liquid nitrogen. Liquid nitrogen, when used, has the benefit of being a common cryogenic fluid. Liquid hydrogen has been used in the past in superconductor applications; however, due to the very low boiling point of liquid hydrogen, liquid hydrogen is expensive to use and very costly to maintain in liquid form. The use of hydrogen gas can also be dangerous, thus is not used in most commercial applications. In another and/or alternative non-limiting embodiment of the invention, the cooling liquid can be contained in a chamber that partially or fully surrounds the HTS wire. In one non-limiting aspect of this embodiment, the chamber, when used, can be insulated to keep the cooling liquid cold.

In still another and/or alterative non-limiting aspect of the present invention, an electric current is flowed through one or more induction coils that are formed of or include one or more HTS wires. The current flowing through the one or more induction coils is used to heat and/or melt a workpiece when the workpiece is moved in the magnetic field formed by the one or more induction coils. In one embodiment of the invention, the material to be heated and/or melted is moved generally orthogonal to the static magnetic field, thus forming an electric field that is perpendicular to the direction of movement of the workpiece and the magnetic field. The electric field that is formed induces currents in the workpiece that cause resistive losses that result in the heating of the workpiece. Additionally, currents can be induced in an electrically conducting workpiece when it is moved in the direction of the static field and the intensity of the magnetic field is varied in the same direction. In another embodiment of the invention, the material to be heated and/or melted is moved through a non-static or alternating magnetic field.

In yet another and/or alterative non-limiting aspect of the present invention, the HTS material that is used in the HTS wire of the present invention is superconductive at temperatures (i.e., critical temperature) of at least about 76° K (−197° C.). The HTS wire of the present invention can be formed of one or more superconductive materials. When more than one HTS wire is used in an inductor coil, the materials used in the one or more HTS wires can be the same or different. Non-limiting examples of superconductive materials and their maximum temperature that such material maintain superconductive properties that can fully or partially be used to form the HTS wire that is used in the present invention include, but are not limited to, $Sn_{1.4}In_{0.6}Ba_4Tm_5Cu_7O_{20+}$ (175° K); $SnInBa_4Tm_4Cu_6O_{18+}$(150° K); $Sn_4Ba_4(Tm_2Ca)Cu_7O_x$(127° K); $(Hg_{0.8}Tl_{0.2})Ba_2Ca_2Cu_3O_{8.33}$(138° K); $HgBa_2Ca_2Cu_3O_8$ (135° K); $HgBa_2Ca_3Cu_4O_{10+}$ (126° K); $HgBa_2(Ca_{1-x}Sr_x)Cu_2O_{6+}$ (125° K); $HgBa_2CuO_4+$ (98° K); $Tl_2Ba_2Ca_2Cu_3O_{10}$ (128° K); $(Tl_{1.6}Hg_{0.4})Ba_2Ca_2Cu_3O_{10+}$ (126° K); $TlBa_2Ca_2Cu_3O_{9+}$ (123° K); $(Tl_{0.5}Pb_{0.5})Sr_2Ca_2Cu_3O_9$ (120° K); $Tl_2Ba_2CaCu_2O_6$ (118° K); $TlSnBa_4TmCaCu_4O_x$ (115° K); $TlBa_2Ca_3Cu_4O_{11}$ (112° K); $TlBa_2CaCu_2O_{7+}$ (103° K) $Tl_2Ba_2CuO_6$ (95°K); $TlSnBa_4Y_2Cu_4O_x$(86° K); $Sn_2Ba_2(Tm_{0.5}Ca_{0.5})Cu_3O_{8+}$(115° K); $SnInBa_4Tm_3Cu_5O_x$(113° K); $Sn_3Ba_4Tm_3Cu_6O_x$(109° K); $Sn_3Ba_8Ca_4Cu_{11}O_x$(109° K); $SnBa_4Y_2Cu_5O_x$(107° K); $Sn_4Ba_4Tm_2YCu_7O_x$ (104° K); $Sn_4Ba_4CaTmCu_4O_x$(100° K); $Sn_4Ba_4Tm_3Cu_7O_x$(98° K); $Sn_2Ba_2(Y_{0.5}Tm_{0.5})Cu_3O_{8+}$(96° K); $Sn_3Ba_4Y_2Cu_5O_x$(91° K); $SnInBa_4Tm_4Cu_6O_x$(87° K); $Sn_2Ba_2(Sr_{0.5}Y_{0.5})Cu_3O_8$ (86° K); $Sn_4Ba_4Y_3Cu_7O_x$ (80° K); $Bi_{1.6}Pb_{0.6}Sr_2Ca_2Sb_{0.1}Cu_3O_y$(115° K); $Bi_2Sr_2Ca_2Cu_3O_{10}$ (110° K); $Bi_2Sr_2CaCu_2O_9$(110° K); $Bi_2Sr_2(Ca_{0.8}Y_{0.2})Cu_2O_8$ (96° K); $Bi_2Sr_2CaCu_2O_8$(92° K); $(Ca_{1-x}Sr_x)CuO_2$ (110° K); $YSrCa_2Cu_4O_{8+}$ (101° K); $(Ba,Sr)CuO_2$(90° K); $BaSr_2CaCu_4O_{8+}$(90° K); $Pb_3Sr_4Ca_3Cu_6O_x$(106° K); $Pb_3Sr_4Ca_2Cu_5O_{15+}$ (101° K): $(Pb_{1.5}Sn_{1.5})Sr_4Ca_2Cu_5O_{15+}$ (95° K); $AuBa_2Ca_3Cu_4O_{11}$(99° K); $AuBa_2(Y, Ca)Cu_2O_7$(82° K); $(Y_{0.5}Lu_{0.5})Ba_2Cu_3O_7$ (107° K); $(Y_{0.5}Tm_{0.5})Ba_2Cu_3O_7$ (105° K); $(Y_{0.5}Gd_{0.5})Ba_2Cu_3O_7$ (97° K); $Y_2CaBa_4Cu_7O_{16}$ (97° K); $Y_3Ba_4Cu_7O_{16}$ (96° K); $NdBa_2Cu_3O_7$ (96° K); $Y_2Ba_4Cu_7O_{15}$ (95° K); $GdBa_2Cu_3O_7$ (94° K); $YBa_2Cu_3O_7$ (92° K); $TmBa_2Cu_3O_7$ (90° K); $YbBa_2Cu_3O_7$ (89° K); $GaSr_2(Ca_{0.5}Tm_{0.5})Cu_2O_7$ (99° K); $Ga_2Sr_4Y_2CaCu_5O_x$ (85° K); $Ga_2Sr_4Tm_2CaCu_5O_x$ (81° K); and/or $La_2Ba_2CaCu_5O_{9+}$(79° K). The temperature next to each of the materials listed above is the believed critical temperature of superconductivity for such material. As can be appreciated, other or additional superconductive materials can be used to fully or partially form the HTS wire. As can also be appreciated, more than one superconductive material can be used to fully or partially form the HTS wire.

In still yet another and/or alternative non-limiting aspect of the present invention, the HTS wire of the present invention that is used in an induction coil is formed of a plurality of layers of material. In one non-limiting embodiment of the invention, there is provided a base metal layer that forms the backbone of the HTS wire. This base metal layer is generally not a superconductive material. In one non-limiting aspect of this embodiment, the base metal layer is formed of non-magnetic metals or non-magnetic metal alloys. In another non-limiting aspect of this embodiment, the base metal layer includes or is fully formed of a metal alloy that includes one or more of the following metals, namely aluminum, copper, lead, magnesium, nickel, platinum, nickel, silver, and tungsten. In still another non-limiting aspect of this embodiment, the base metal layer is formed of an alloy that includes nickel and tungsten. In yet another non-limiting aspect of this embodiment, the base metal layer is formed of an alloy that includes at least about 90 weight percent nickel and tungsten. In still yet another non-limiting aspect of this embodiment, the base metal layer is formed of an alloy that includes at least about 95 weight percent nickel and tungsten. The base metal layer is generally the thickest layer of the HTS wire; however, this is not required. The base metal layer can be formed of one or more layers of metal. When two or more metal layers are used to form the base metal layer, the composition of the different metal layers can be the same or different. In another and/or alternative embodiment of the present invention, the HTS wire can include one or more layers of buffer materials between the base metal layer and the superconductive material in the HTS wire; however, this is not required. These one of more buffer layers, when used, are typically a ceramic material formed of one or more oxides of rare earth metals; however, this is not required. Non-limiting examples of materials that can be used to form one or more of the buffer layers include, but are not limited to, cerium oxide, yttrium oxide and yttrium-stabilized zirconium ceramic. In one non-limiting aspect of this embodiment, a plurality of buffer layers are included on the HTS wire. In still another and/or alternative embodiment of the present invention, the HTS wire includes one or more layers of superconductive material positioned at least partially on the base metal layer and or one or more buffer layers, when used. In yet another and or alternative embodiment of the present invention, the HTS wire includes a top metal layer on top of the one or more layers of superconductive material. In one non-limiting aspect of the embodiment, the base metal layer and top metal layer are designed to provide protection to the top, sides and base of the HTS wire. In another and/or alternative non-limiting aspect of this embodiment, the top metal layer includes one or more noble metals (e.g., gold, palladium, platinum, rhodium, silver, tantalum, etc.). In one non-limiting aspect of this embodiment, the noble metal includes silver. In another non-limiting aspect of this embodiment, the noble metal includes at least about 50 weight percent silver. In still another non-limiting aspect of this embodiment, the noble metal includes at least about 80 weight percent silver. In yet another non-limiting aspect of this embodiment, the noble metal includes at least about 90 weight percent silver. The top metal layer can be formed of one or more layers of metal. When two or more metal layers are used to form the top metal layer, the composition of the different metal layers can be the same or different.

In another and/or alternative non-limiting aspect of the present invention, there is provided one or more power cable arrangements that connect a power supply to one or more induction coils, wherein the power cable includes one or more HTS wires of the present invention. In one non-limiting arrangement, the power cable connects to one or more induction coils, wherein the induction coil includes one or more HTS wires of the present invention. In one non-limiting embodiment of the invention, one or more layers of HTS wires in the power cable can be wound about a core; however, this is not required. The core, when used can be a metal core; however, this is not required. The core, when used, is generally formed of an electrically conductive material; however, this is not required. The core, when used, is generally formed of a non-magnetic material; however, this is not required. Non-limiting materials that can be used to at least partially form the core, when used, include, but are not limited to, aluminum, copper, lead, magnesium, platinum, silver and tungsten. As can be appreciated, the core, when used, can be formed of more than one material; however, this is not required. In another and/or alternative non-limiting embodiment of the invention, the power cable can include a high voltage dielectric material that is positioned about the one or more HTS wires; however, this is not required. The high voltage dielectric material is used to at least partially electrically insulate the one or more HTS wires from the outer layers of the power cable. Various types of dielectric materials can be used (e.g., ceramic materials, plastics, fiber reinforced materials, etc.). In one non-limiting embodiment, the dielectric material can include, but is not limited to, FRP (Fiberglass Reinforced Plastic), PVC (Poly Vinyl Chloride), etc. In one non-limiting design, the dielectric material is a FRP sold commercially as G-10. In another and/or alternative non-limiting embodiment of the invention, the power cable can include an HTS shield tape that is wrapped directly around the one or more HTS wires or around the high voltage dielectric material, when used. In still another and/or alternative non-limiting embodiment of the invention, the power cable can include a shielding layer that is wrapped directly around the HTS shield tape, when used, or around the high voltage dielectric material, when used. The shielding layer, when used, is generally formed of a non-magnetic material; however, this is not required. Non-limiting materials that can be used to at least partially form the shielding layer, when used, include, but are not limited to, aluminum, copper, lead, magnesium, platinum, silver and tungsten. As can be appreciated, the shielding layer, when used, can be formed of one or more layers. As can also be appreciated, the shielding can be formed of one or more materials. In yet another and/or alternative non-limiting embodiment of the invention, the power cable includes an inner cryostat wall. The inner cryostat wall is positioned about and at least partially spaced from the one or more HTS wires, or the high voltage dielectric material, when used, or the HTS shield tape, when used, or the shielding layer, when used, so as to form a passageway for a cooling fluid (e.g., liquid nitrogen, etc.) to at least partially flow about and cool the core, when used, the one or more HTS wires, or the high voltage dielectric material, when used, or the HTS shield tape, when used, or the shielding layer, when used. The inner cryostat wall can be formed of any type of durable material that can withstand contact with the cooling fluid. Typically the inner cryostat wall is a non-conducting material; however, this is not required. Non-limiting materials that can be used include FRP: however, other materials can be used. As can be appreciated, a second inner cryostat wall can be positioned about the first cryostat wall to allow a cooling fluid to flow between the first and second cryostat walls; however, this is not required. The second inner cryostat wall, when used, can be formed of the same materials as the first inner cryostat wall; however, this is not required. In still yet another and/or alternative non-limiting embodiment of the invention, the power cable can include a thermo-insulation material positioned at least partially about one or more of the inner cryostat walls so as to provide additional insulation to the cooling fluid; however, this is not required. Many different types of thermo-insulation materials can be used. In another and/or alternative non-limiting embodiment of the invention, an outer cryostat wall can be positioned at least partially about the thermo-insulation material; however, this is not required. The outer cryostat wall, when used, can be formed of the same or different material from the inner cryostat wall. The outer cryostat wall, when used, provides additional insulation to the cooling fluid. In still another and/or alternative non-limiting embodiment of the invention, the power cable generally includes an outer protective covering to protect the internal components of the power cable. Many different materials can be used for the protective coating (e.g., plastic coating, rubber coating, etc.). Although a power cable for supplying power from a power source to one or more induction coils has been described, it can be appreciated that an induction coil having one or more of the components of the power cable can be used in the present invention. In particular, the present invention contemplates an induction coil that can controllably channel cooling fluid through one or more passageways about the one or more HTS wires of the induction coil so as to coil the one or more HTS wires during operation of the induction coil.

In still another and/or alterative non-limiting aspect of the present invention, the induction coil of the present invention can be designed so that a workpiece can be heated or melted when the workpiece is at least partially positioned at or about a center of one or more coiled turns of the induction coil. Such an arrangement is defined as a coreless type induction coil arrangement. The workpiece can be designed to be at least partially passed into or through the coiled turns of the induction coil. Alternatively, the workpiece can be designed to be at least partially positioned within the coiled turns of the induction coil. In one non-limiting embodiment the operating parameters of the coreless type induction coil arrangement can be greater than 60 Hz and greater than 1 kW. In one non-limiting aspect of this embodiment, the coreless type induction coil arrangement is operated at at least 100 Hz. In another non-limiting aspect of this embodiment, the coreless type induction coil arrangement is operated at up to about 100 kHz. In still another non-limiting aspect of this embodiment, the coreless type induction coil arrangement is operated at at least about 25 kW. In yet another non-limiting aspect of this embodiment, the coreless type induction coil arrangement is operated at up to about 12 Megawatts. As can be appreciated, lower or higher watt values can be used for the coreless type induction coil arrangement.

In yet another and/or alternative non-limiting aspect of the present invention, the induction coil of the present invention can be designed so that a workpiece can be heated or melted when the workpiece is at least partially positioned or at least partially passed next to one or more induction coils. Such an arrangement is defined as a strip type induction coil arrangement. In one non-limiting embodiment, the operating parameters of the strip type induction coil arrangement can be greater than 60 Hz and greater than 1 kW. In one non-limiting aspect of this embodiment, the strip type induction coil arrangement is operated at at least 100 Hz. In another non-limiting aspect of this embodiment, the strip type induction coil arrangement is operated at up to about 100 kHz. In still another non-limiting aspect of this embodiment, the strip type induction coil arrangement is operated at at least about 1 Megawatt. In still yet another non-limiting aspect of this embodiment, the strip type induction coil arrangement is operated at up to about 6 Megawatts. As can be appreciated, lower or higher watt values can be used for the strip type induction coil arrangement.

In one non-limiting object of the present invention is to provide an inductor that uses a superconducting material.

In another non-limiting object of the present invention is provided an inductor that uses a High HTS superconductor material.

In still another non-limiting object of the present invention is provided an inductor that uses a High HTS superconductor material and operates at at least about 100 Hz and at least about 25 kW.

In yet another non-limiting object of the present invention is provided an inductor that includes a specially configured induction coil that includes HTS superconductor material.

These and other objects and advantages will become apparent to those skilled in the art upon the reading and following of this description taken together with the accompanying drawings.

BRIEF DESCRIPTION OF DRAWINGS

Reference may now be made to the drawings, which illustrate various embodiments that the invention may take in physical form and in certain parts and arrangements of parts wherein.

DETAILED DESCRIPTION OF NON-LIMITING EMBODIMENTS OF THE INVENTION

Figure 1:
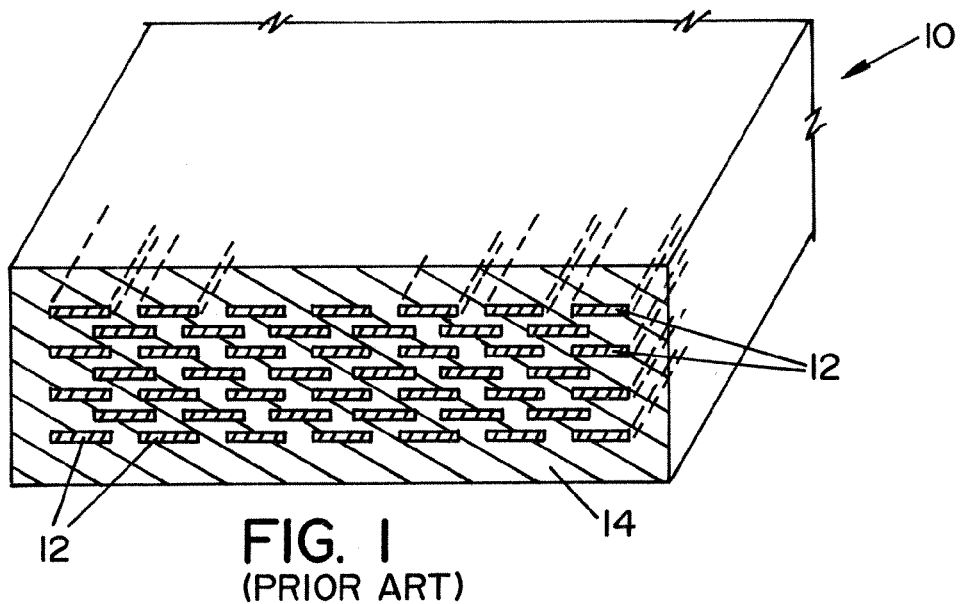
FIG. 1 illustrates a prior art first generation HTS wire that is in the form of a multi-filamentary composite.

Referring now in greater detail to the drawings, wherein the showings are for the purpose of illustrating various embodiments of the invention only, and not for the purpose of limiting the invention, a first generation superconductive wire 10 is illustrated in FIG. 1. The first generation superconductive wire included a matrix of superconducting filaments 12 that were encapsulated in a silver alloy 14. The superconducting filaments are spaced from one another and are formed of a superconducting material that has superconducting properties at temperatures below 77° K. The structure and materials used in the first generation superconductive wire limited the amount of current that could flow through the first generation superconductive wire and the current frequency that could be handled by the first generation superconductive wire. Typically, no more than 60 Hz current frequencies could be successfully passed through the first generation superconductive wire. In addition, the first generation superconductive wire typically could only handle less than about 1 kW of power. These limitations resulted in such first generation superconductive wires being problematic for use in various types of induction heating systems.

Figure 2:
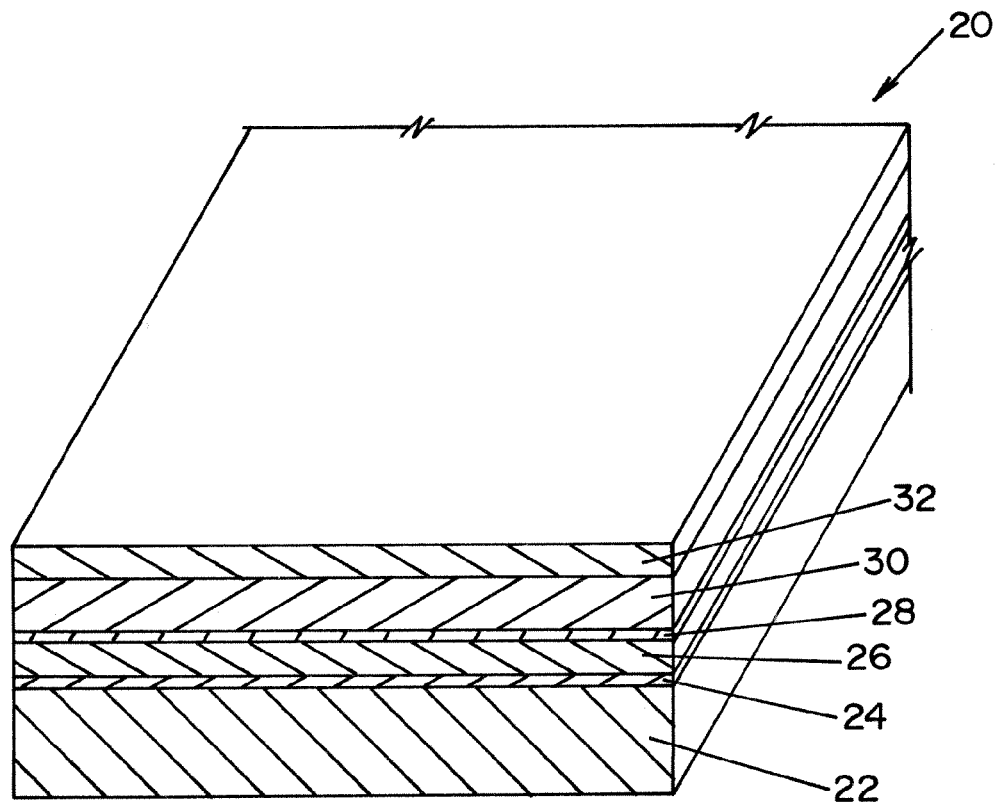
FIG. 2 illustrates a second generation HTS wire that is in the form of a coated conductor composite which can be used in the present invention.

Referring now to FIG. 2, there is illustrated a non-limiting second generation HTS wire 20 which can be used to form a part of an induction coil which can be used in the present invention. The second generation HTS wire 20 is a configuration and is formed of a material that enables the second generation HTS wire to operate at current frequencies exceeding 60 Hz and power levels exceeding 1 kW. The second generation HTS wire is a multilayer wire that includes a base metal layer, a buffer layer, superconductive material, and a top metal layer. As can be appreciated, other layers can be included in the second generation HTS wire 20. As illustrated in FIG. 2, the second generation HTS wire 20 includes a base metal layer 22 that is formed of non-magnetic metals or non-magnetic metal alloys. For example, the base metal layer can be formed of an alloy of nickel and tungsten. The base metal layer is generally the thickest layer of the second generation HTS wire; however, this is not required. Positioned on top of the base metal layer are one or more buffer layers. As illustrated in FIG. 2, three buffer layers 24, 26, 28 are included in the second generation HTS wire. As can be appreciated, a larger or smaller number of buffer layers can be used. In one non-limiting example, buffer layer 24 is a yttrium oxide layer, buffer layer 26 is a yttrium-stabilized zirconia layer, and buffer layer 28 is a cerium oxide layer. The thickness of the buffer layers can be the same or different. One or more layers of superconductive material 30 is positioned on the top of buffer layer 28. Superconductive material is a material that is superconductive at temperatures of 77° K or higher. In one non-limiting example, superconductive material 30 is $YBa_2Cu_3O_7$. This superconductive material is superconductive to temperatures up to about 92° K. If more than one layer of superconductive material 30 is used, such layers of superconductive material can have the same or different composition and/or thickness. The second generation HTS wire 20 includes a top metal layer 32 that is positioned on top of the one or more layers of superconductive material 30. The top metal layer includes one or more noble metals and/or one or more noble metal layers. For example, the top metal layer is a silver layer. The top metal layer and the base layer can be used to partially or fully encapsulate the other layers of the second generation HTS wire; however, this is not required.

Figure 3:
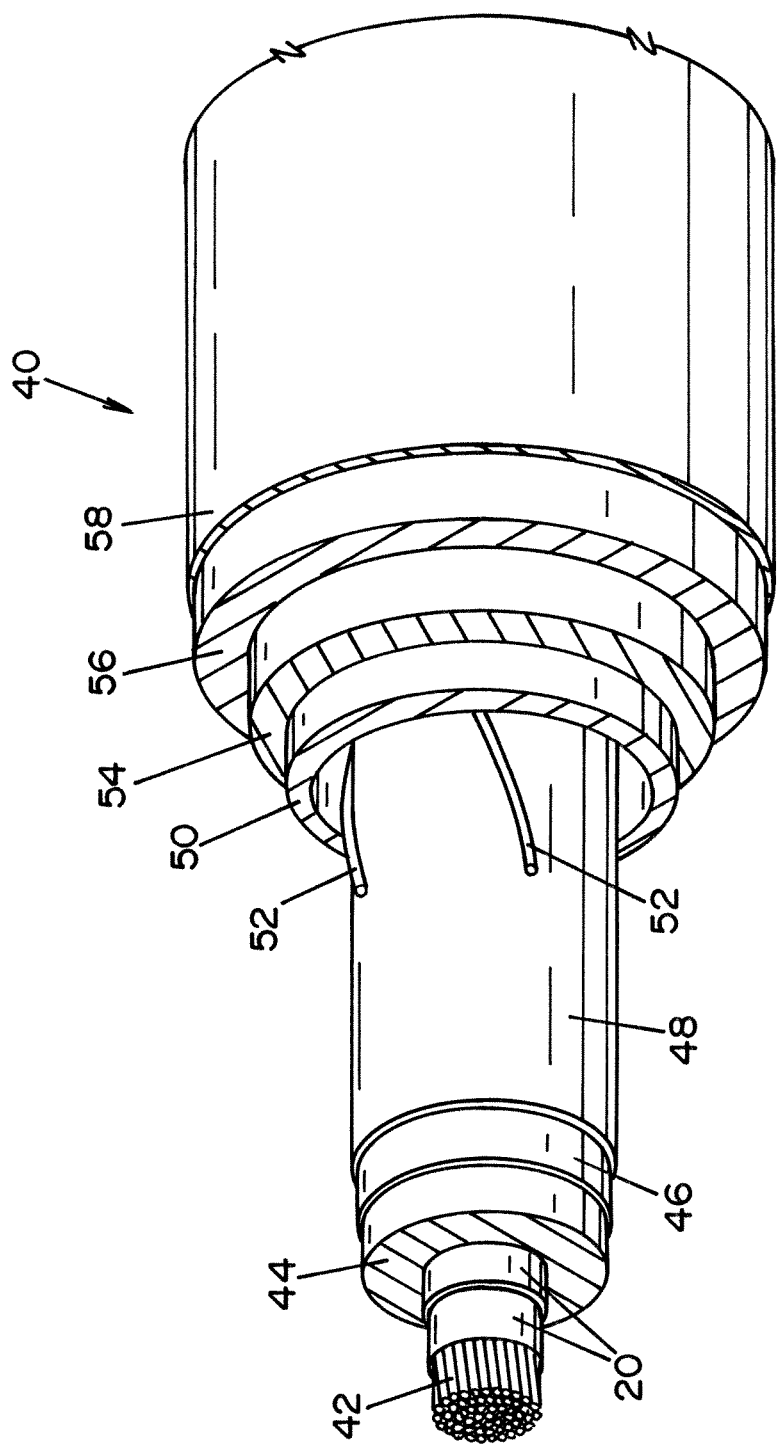
FIG. 3 illustrates a sectional view of a non-limiting HTS coaxial cold dielectric superconductor cable that can be used in the present invention.

Referring now to FIG. 3, there is illustrated one non-limiting configuration of an HTS coaxial cold dielectric superconductor cable 40 that can be used in an induction heating system of the present invention. Superconductor cable 40 typically includes a core, second generation HTS wire positioned at least partially about the core, and an inner cryostat wall spaced from the second generation HTS wire to form a cooling fluid channel between the inner cryostat wall and the second generation HTS wire. As can be appreciated, the HTS coaxial cold dielectric superconductor cable 40 can include additional layers. As illustrated in FIG. 3, superconductor cable 40 includes a metal core 42. Metal core 42 is generally formed of an electrically conductive material and a non-magnetic material; however, this is not required. For example, the metal core can be formed of a copper wire or copper cable. Wrapped about core 42 are two layers of second generation HTS wire 20. Positioned about the second generation HTS wire is a high voltage dielectric material 44. The high voltage dielectric material is used to at least partially electrically insulate the second generation HTS wires from the outer layers of the superconductive coil. One or more layers of shielding wire and/or tape can be positioned about the high voltage dielectric material. As illustrated in FIG. 3, an HTS shield tape 46 is positioned about high voltage dielectric material 44 and a copper shield wire 48 is positioned about the HTS shield tape 46. An inner cryostat wall 50 is positioned about, and at least partially spaced from the copper shield wire 48. A plurality of spacers 52 can be used to maintain the spacing between the copper shield wire 48 and the inner cryostat wall 50; however, this is not required. The space between the copper shield wire 48 and the inner cryostat wall 50 forms a passageway for a cooling fluid (e.g., liquid nitrogen, etc.) to at least partially flow about and cool one or more of the electrically conductive components of the superconductive cable 40 (i.e. metal core 42, second generation HTS wire 20, etc.). Positioned about the inner cryostat wall 50 is a thermo-insulation material 54 that can be used to provide additional insulation to the cooling fluid that is used to cool the electrically conductive components of the superconductive cable 40. An outer cryostat wall 56 can be positioned at least partially about the thermo-insulation material 54 to provide additional insulation to the cooling fluid. An outer protective covering 58 can be positioned about the outer cryostat wall 56 to protect the internal components of the superconductive coil 40.

Figure 4:
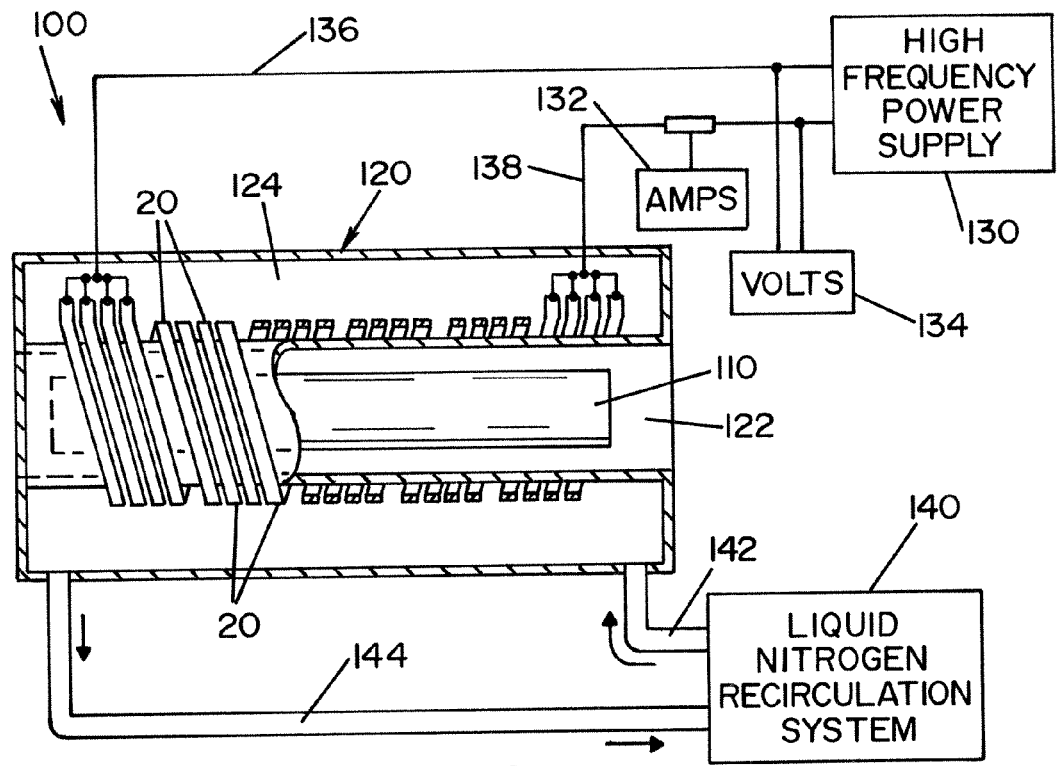
FIG. 4 shows schematically a non-limiting embodiment of an apparatus according to the invention.

Referring now to FIGS. 4-7, various non-limiting configurations of induction heating systems in accordance with the present invention are illustrated. Referring now to FIG. 4, induction heating apparatus 100 is designed to heat a workpiece or blank 110. The workpiece can be designed to partially or continuously move through apparatus 100 during the heating process, be maintained in position during the heating process, or be rotated during the heating process. Apparatus 100 includes a chamber 120 that has a cavity or passageway 122. The cavity of passageway 122 can be positioned through the middle of the chamber; however, this is not required. The cavity or passageway 122 is designed to at least partially receive workpiece or blank 110. Chamber 120 also includes a cooling cavity 124 that is partially or fully positioned about cavity or passageway 122. One or more superconductive cables 40 or one or more second generation HTS wires 20 are positioned in the cooling cavity and are at least partially wrapped at least partially around cavity or passageway 122 and at least partially along the length of cavity or passageway 122. The one or more superconductive cables 40 or one or more second generation HTS wires 20 are connected by power cables 136, 138 to a high frequency power source 130 (e.g., 70 Hz-100 kHz & 1 kW-12 Megawatts, etc.). These power cables can include one or more HTS wires; however, this is not required. In one non-limiting designed, power cable 136 is similar in design to superconductive cable 40. Power cable 136, when similar in design to superconductive cable 40, can be cooled by a cooling liquid. In another or additional design, power cable 138 is also similar in design to superconductive cable 40. Power cable 138, when similar in design to superconductive cable 40, can also be cooled by a cooling liquid. The high frequency power source can include voltage controllers/monitors 132 and/or amperage controllers/monitors 134. The one or more superconductive cables 40 or one or more second generation HTS wires 20 are at least partially cooled during the operation of the induction heating system by flowing a cooling fluid (e.g., liquid nitrogen, etc.) through cooling cavity 124. As indicated by the flow arrows, a liquid nitrogen recirculation system 140 causes liquid nitrogen to flow into cooling cavity 124 via pipe 142 and from cooling cavity 124 to liquid nitrogen recirculation system 140 via pipe 144.

During operation of the induction heating apparatus 100, current flows through the one or more superconductive cables 40 or one or more second generation HTS wires 20 to set up an electrical field that induces currents in the workpiece or blank 110 thereby causing the workpiece or blank 110 to be heated.

Figure 5:
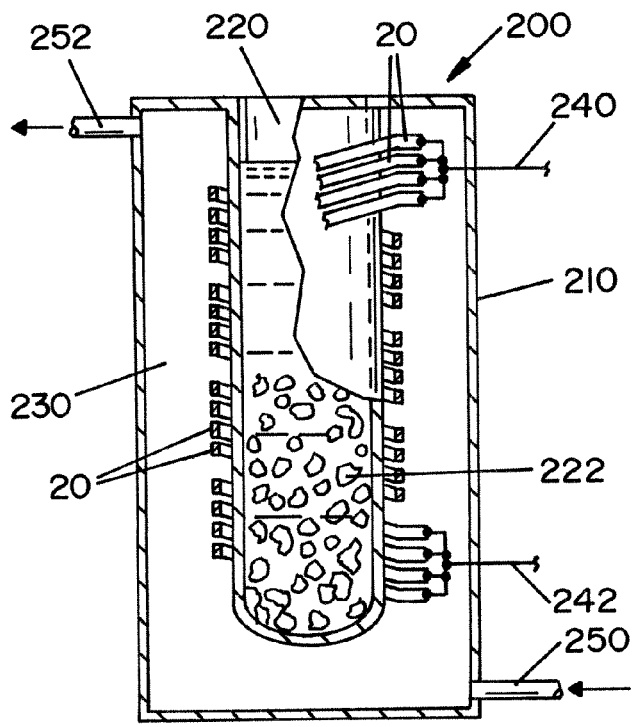
FIG. 5 shows schematically another non-limiting embodiment of an apparatus according to the invention; and, FIGS. 6 and 7 show schematically another non-limiting embodiment of an apparatus according to the invention.

Referring now to FIG. 5, a modification of the induction heating apparatus 100 is illustrated. FIG. 5 illustrates an induction heated crucible 200 that is used to heat or melt material in the crucible 210. Crucible 210 includes a melting cavity 220 that is used to contain materials 222 to be melted or heated by induction heated crucible 200. Crucible 210 also includes a cooling cavity 230 that is partially or fully positioned about melting cavity 220. One or more superconductive cables 40 or one or more second generation HTS wires 20 are positioned in the cooling cavity and are at least partially wrapped at least partially around melting cavity 220 and at least partially along the length of melting cavity 220. The one or more superconductive cables 40 or one or more second generation HTS wires 20 are connected by power cables 240, 242 to a high frequency power source, not shown. These power cables can include one or more HTS wires; however, this is not required. In one non-limiting design, power cable 240 is similar in design to superconductive cable 40. Power cable 240, when similar in design to superconductive cable 40, can be cooled by a cooling liquid. In another or additional design, power cable 242 is also similar in design to superconductive cable 40. Power cable 242, when similar in design to superconductive cable 40, can also be cooled by a cooling liquid. The high frequency power source can include voltage controllers/monitors and/or amperage controllers/monitors. The one or more superconductive cables 40 or one or more second generation HTS wires 20 are at least partially cooled during the operation of the induction heated crucible by flowing a cooling fluid (e.g., liquid nitrogen, etc.) through cooling cavity 230. As indicated by the flow arrows, a liquid nitrogen recirculation system, not shown, causes liquid nitrogen to flow into cooling cavity 230 via pipe 250 and from cooling cavity 230 to the liquid nitrogen recirculation system via pipe 252.

During operation of induction heated crucible 200, current flows through the one or more superconductive cables 40 or one or more second generation HTS wires 20 to set up an electrical field that induces currents in material 222 thereby causing the materials to be heated or melted.

Figure 6:
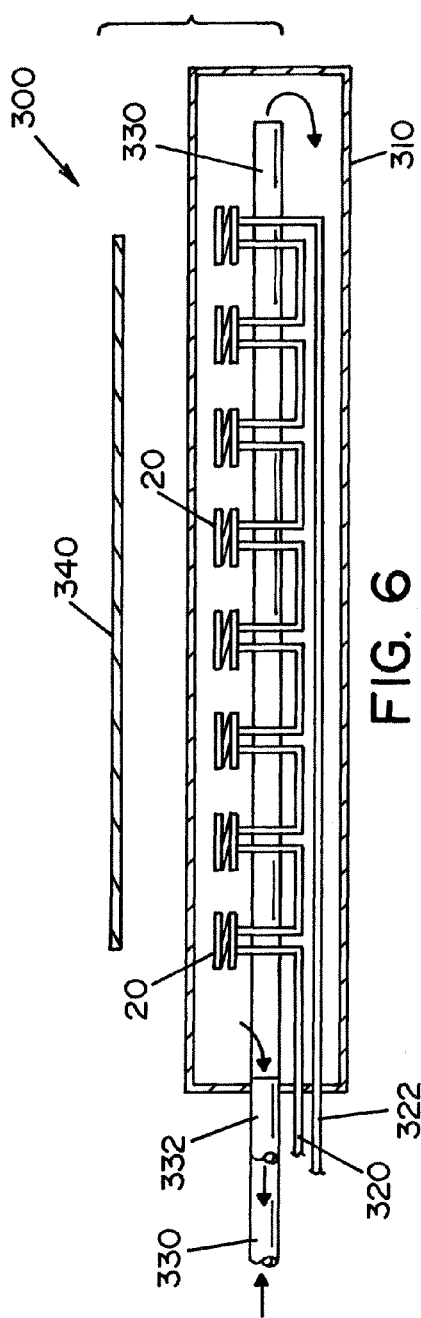
Figure 7:
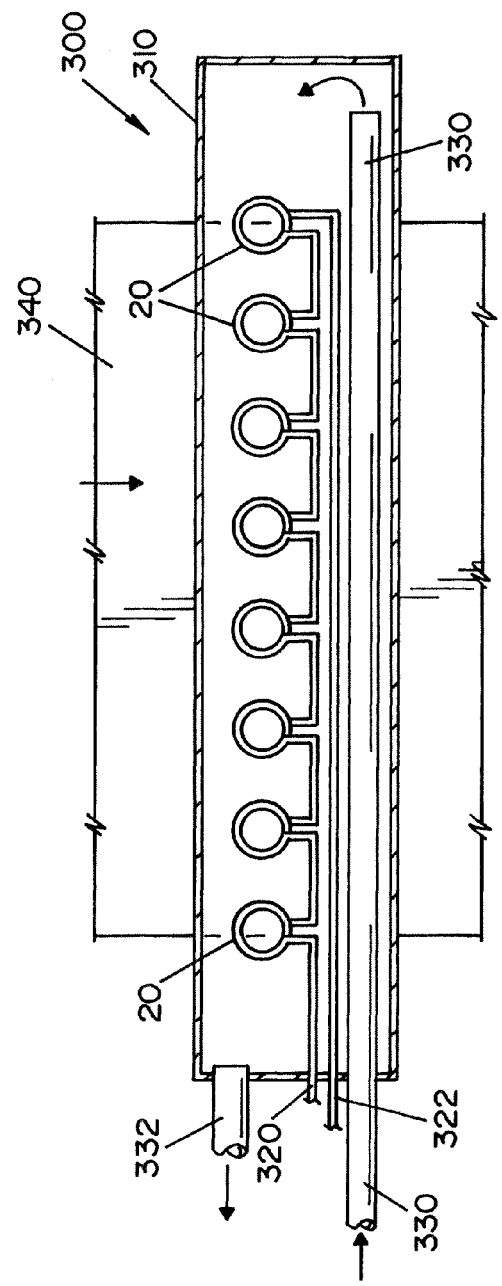

Referring now to FIGS. 6 and 7, another induction heating apparatus 300 is illustrated. The induction heating apparatus includes a cooling chamber 310. Positioned in the cooling chamber is one or more superconductive cables 40 or one or more second generation HTS wires 20. The one or more superconductive cables 40 or one or more second generation HTS wires 20 are connected by power cables 320, 322 to a high frequency power source, not shown. These power cables can include one or more HTS wires; however, this is not required. In one non-limiting design, power cable 320 is similar in design to superconductive cable 40. Power cable 320, when similar in design to superconductive cable 40, can be cooled by a cooling liquid. In another or additional design, power cable 322 is also similar in design to superconductive cable 40. Power cable 322, when similar in design to superconductive cable 40, can also be cooled by a cooling liquid. The high frequency power source can include voltage controllers/monitors and/or amperage controllers/monitors. The one or more superconductive cables 40 or one or more second generation HTS wires 20 are at least partially cooled during the operation of the induction heating apparatus by flowing a cooling fluid (e.g., liquid nitrogen, etc.) through cooling chamber 310. As indicated by the flow arrows, a liquid nitrogen recirculation system, not shown, causes liquid nitrogen to flow into cooling chamber 310 via pipe 330 and from cooling chamber 310 to the liquid nitrogen recirculation system via pipe 332.

During operation of the induction heating apparatus 300, current flows through the one or more superconductive cables 40 or one or more second generation HTS wires 20 to set up an electrical field that induces currents in a plate or workpiece 340 thereby causing the plate or workpiece to be heated or melted. As illustrated by the arrow in FIG. 7, the plate or workpiece 340 can be moved relative to the cooling chamber. As also illustrated in FIGS. 6 and 7, the plate or workpiece are positioned adjacent to the cooling chamber during the heating of the plate or workpiece.

It will thus be seen that the objects set forth above, among those made apparent from the preceding description, are efficiently attained, and since certain changes may be made in the constructions set forth without departing from the spirit and scope of the invention, it is intended that all matter contained in the above description and shown in the accompanying drawings shall be interpreted as illustrative and not in a limiting sense. The invention has been described with reference to preferred and alternate embodiments. Modifications and alterations will become apparent to those skilled in the art upon reading and understanding the detailed discussion of the invention provided herein. This invention is intended to include all such modifications and alterations insofar as they come within the scope of the present invention. It is also to be understood that the following claims are intended to cover all of the generic and specific features of the invention herein described and all statements of the scope of the invention, which, as a matter of language, might be said to fall therebetween. The invention has been described with reference to the preferred embodiments. These and other modifications of the preferred embodiments as well as other embodiments of the invention will be obvious from the disclosure herein, whereby the foregoing descriptive matter is to be interpreted merely as illustrative of the invention and not as a limitation. It is intended to include all such modifications and alterations insofar as they come within the scope of the appended claims.

We claim:

1. An induction heating apparatus that can operate at current frequencies of greater than 60 Hz and at at least 1 kW, said induction heating apparatus comprising a high frequency power supply, a superconductive induction coil, a superconductive power cable, and a fluid cooling system; said high frequency power supply designed to generate current frequencies of over 60 Hz and to generate at least 1 kW of power, said superconductive power cable connected to said high frequency power supply and said superconductive induction coil to enable power from said high frequency power supply to flow through said superconductive induction coil, said superconductive power cable formed of one or more different materials form said superconductive induction coil and having a different configuration from said superconductive induction coil, said superconductive power cable comprising a core, a high temperature superconductor material positioned at least partially about said core, and an inner cryostat wall spaced from said high temperature superconductor material to form a cooling fluid channel between said inner cryostat wall and said high temperature superconductor material; said fluid cooling system designed to cool said superconductive induction coil and said superconductive power cable; said superconductive induction coil designed to generate a magnetic induction field when current from said high frequency power supply flows therethrough thereby causing a workpiece in close proximity to said superconductive induction coil to be heated or melted.

2. The induction heating apparatus as defined in claim 1, wherein said fluid cooling system designed to cause a cooling fluid to flow at least partially through said cooling fluid channel of said superconductive power cable at least partially during a time when said high frequency power supply causes current to flow into said superconductive induction coil.

3. The induction heating apparatus as defined in claim 1, wherein said superconductive induction coil is at least partially positioned in a housing and at least partially immersed in said cooling fluid at least partially during a time when said high frequency power supply causes current to flow into said superconductive induction coil.

4. The induction heating apparatus as defined in claim 1, wherein said cooling fluid is liquid nitrogen.

5. The induction heating apparatus as defined in claim 1, wherein said high frequency power supply is designed to generate current frequencies of at least 100 Hz to no more than about 100 kHz and to generate at least 25 kW of power and up to about 12 Megawatts of power through said superconductive induction coil.

6. The induction heating apparatus as defined in claim 1, wherein said high frequency power supply is designed to generate current frequencies of at least about 500 Hz to no more than about 100 kHz and to generate at least 25 kW of power and up to about 12 Megawatts of power through said superconductive induction coil.

7. The induction heating apparatus as defined in claim 1, wherein said high frequency power supply is designed to generate current frequencies of at least about 1 kHz to no more than about 100 kHz and to generate at least 25 kW of power and up to about 12 Megawatts of power through said superconductive induction coil.

8. The induction heating apparatus as defined in claim 1, including a plurality of superconductive induction coils.

9. The induction heating apparatus as defined in claim 1, wherein at least one of the superconductive induction coils arrange to form a coreless type induction coil arrangement.

10. The induction heating apparatus as defined in claim 1, wherein at least one of the superconductive induction coils arrange to form a strip type induction coil arrangement.

11. The induction heating apparatus as defined in claim 1, wherein said high temperature superconductor material including a superconductive wire, said superconductive wire comprising a base metal, a superconductive material, and a top metal, said base metal formed of a non-magnetic metal or non-magnetic metal alloy, said top metal including a noble metal.

12. The induction heating apparatus as defined in claim 11, wherein said base metal includes one or more metals selected from the group consisting of aluminum, copper, lead, magnesium, nickel, platinum, silver, and tungsten.

13. The induction heating apparatus as defined in claim 12, wherein said base metal includes one or more metals selected from the group consisting of nickel, and tungsten.

14. The induction heating apparatus as defined in claim 11, wherein said top metal includes silver.

15. The induction heating apparatus as defined in claim 11, wherein said superconductive material has a critical temperature above 90° K.

16. The induction heating apparatus as defined in claim 15, wherein said superconductive material includes $YBa_2Cu_3O_7$.

17. The induction heating apparatus as defined in claim 11, including at least one buffer layer positioned at least partially between said superconductive material and said base metal.

18. The induction heating apparatus as defined in claim 17, wherein at least one layer of said buffer layer includes a ceramic material formed of at least one oxide of a rare earth metal.

19. The induction heating apparatus as defined in claim 18, wherein said ceramic material includes cerium oxide, yttrium oxide, yttrium-stabilized zirconium ceramic, and combinations thereof.

20. The induction heating apparatus as defined in claim 1, wherein said core includes a non-magnetic metal or non-magnetic metal alloy, said non-magnetic metal or non-magnetic metal alloy includes one or more metals selected from the group consisting of aluminum, and copper.

21. The induction heating apparatus as defined in claim 1, wherein said superconductive power cable includes an outer protective covering.

22. The induction heating apparatus as defined in claim 1, wherein said superconductive power cable includes a dielectric material positioned at least partially about said high temperature superconductor material.

23. The induction heating apparatus as defined in claim 22, wherein said superconductive power cable includes an HTS shield tape positioned at least partially about said high temperature superconductor material, at least partially about said dielectric material, or combinations thereof.

24. The induction heating apparatus as defined in claim 23, wherein said superconductive power cable includes a shielding layer positioned at least partially about said high temperature superconductor material, at least partially about said dielectric material, or combinations thereof, said shielding layer including a non-magnetic metal or non-magnetic metal alloy, said non-magnetic metal or non-magnetic metal alloy includes one or more metals selected from the group consisting of aluminum, copper, lead, magnesium, nickel, platinum, nickel, silver, and tungsten.

25. The induction heating apparatus as defined in claim 24, wherein said superconductive power cable includes a thermo-insulation material positioned at least partially about said high temperature superconductor material, at least partially about said dielectric material, said HTS shield tape, said shielding layer, said inner cryostat wall, and combinations thereof.

26. The induction heating apparatus as defined in claim 25, wherein said superconductive power cable includes an outer cryostat wall that is spaced from said inner cryostat wall, said thermo-insulation material positioned at least partially between said outer cryostat wall and said inner cryostat wall.

27. An induction heating apparatus that can operate at current frequencies of greater than 60 Hz and at least 1 kW, said induction heating apparatus comprising a high frequency power supply, a superconductive induction coil, a superconductive power cable, and a fluid cooling system; said high frequency power supply designed to generate current frequencies of over 60 Hz and to generate at least 1 kW of power, said superconductive poswer cable connected to said high frequency power supply and said superconductive induction coil to enable power from said high frequency power supply to flow through said superconductive induction coil, said superconductive power cable formed of one or more different materials form said superconductive induction coil and having a different configuration from said superconductive induction coil, said superconductive power cable comprising a core, a high temperature superconductor material positioned at least partially about said core, an inner cryostat wall spaced from said high temperature superconductor material to form a cooling fluid channel between said inner cryostat wall and said high temperature superconductor material, outer protective covering, a dielectric material, a HTS shield tape, a shielding layer, a thermo-insulation material, and an outer cryostat wall, said dielectric material positioned at least partially about said high temperature superconductor material, said HTS shield tape positioned at least partially about one or more structures selected from the group consisting of said high temperature superconductor material and said dielectric material, said shielding layer positioned at least partially about one or more structures selected from the group consisting of said high temperature superconductor material and said dielectric material, said thermo-insulation material positioned at least partially about one or more structures selected from the group consisting of said high temperature superconductor material, said dielectric material, said HTS shield tape, said shielding layer and said inner cryostat wall, said outer cryostat wall spaced from said inner cryostat wall, said thermo-insulation material positioned at least partially between said outer cryostat wall and said inner cryostat wall, said shielding layer including a non-magnetic metal or non-magnetic metal alloy, said non-magnetic metal or non-magnetic metal alloy includes one or more metals selected from the group consisting of aluminum, copper, lead, magnesium, nickel, platinum, nickel, silver, and tungsten; said fluid cooling system designed to cool said superconductive induction coil and said superconductive power cable; said superconductive induction coil designed to generate a magnetic induction field when current from said high frequency power supply flows therethrough thereby causing a workpiece in close proximity to said superconductive induction coil to be heated or melted, said fluid cooling system designed to cause a cooling fluid to flow at least partially through said cooling fluid channel of said superconductive power cable at least partially during a time when said high frequency power supply causes current to flow into said superconductive induction coil, said superconductive induction coil is at least partially positioned in a housing and at least partially immersed in said cooling fluid at least partially during a time when said high frequency power supply causes current to flow into said superconductive induction coil, said high temperature superconductor material including a superconductive wire, said superconductive wire comprising a base metal, a superconductive material, and a top metal, said base metal formed of a non-magnetic metal or non-magnetic metal alloy, said top metal including a noble metal.

28. The induction heating apparatus as defined in claim 27, wherein said base metal includes one or more metals selected from the group consisting of aluminum, copper, lead, magnesium, nickel, platinum, silver, and tungsten.

29. The induction heating apparatus as defined in claim 27, wherein said superconductive material includes $YBa_2Cu_3O_7$, said superconductive material has a critical temperature above 90° K.

30. The induction heating apparatus as defined in claim 28, wherein said superconductive material includes $YBa_2Cu_3O_7$, said superconductive material has a critical temperature above 90° K.

31. The induction heating apparatus as defined in claim 27, wherein said core includes a non-magnetic metal or non-magnetic metal alloy, said non-magnetic metal or non-magnetic metal alloy includes one or more metals selected from the group consisting of aluminum, and copper.

32. The induction heating apparatus as defined in claim 30, wherein said core includes a non-magnetic metal or non-magnetic metal alloy, said non-magnetic metal or non-magnetic metal alloy includes one or more metals selected from the group consisting of aluminum, and copper.

33. The induction heating apparatus as defined in claim 27, including at least one buffer layer positioned at least partially between said superconductive material and said base metal, said at least one layer of said buffer layer including a ceramic material formed of at least one oxide of a rare earth metal, said ceramic material includes one or more materials selected from the group consisting of cerium oxide, yttrium oxide, and yttrium-stabilized zirconium ceramic.

34. The induction heating apparatus as defined in claim 32, including at least one buffer layer positioned at least partially between said superconductive material and said base metal, said at least one layer of said buffer layer including a ceramic material formed of at least one oxide of a rare earth metal, said ceramic material includes one or more materials selected from the group consisting of cerium oxide, yttrium oxide, and yttrium-stabilized zirconium ceramic.

35. The induction heating apparatus as defined in claim 34, wherein at least one of the superconductive induction coils arrange to form a coreless type induction coil arrangement.

36. The induction heating apparatus as defined in claim 34, wherein at least one of the superconductive induction coils arrange to form a strip type induction coil arrangement.

* * * * *